United States Patent
Chai

(10) Patent No.: US 11,997,875 B2
(45) Date of Patent: May 28, 2024

(54) DISPLAY DEVICE AND METHOD OF MANUFACTURING THE SAME

(71) Applicant: SAMSUNG DISPLAY CO., LTD., Yongin-si (KR)

(72) Inventor: Youngki Chai, Hwaseong-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 245 days.

(21) Appl. No.: 17/471,896

(22) Filed: Sep. 10, 2021

(65) Prior Publication Data

US 2022/0158138 A1 May 19, 2022

(30) Foreign Application Priority Data

Nov. 13, 2020 (KR) .................. 10-2020-0151538

(51) Int. Cl.
| | | |
|---|---|---|
| H01L 51/52 | (2006.01) | |
| G02B 5/30 | (2006.01) | |
| H01L 51/56 | (2006.01) | |
| H10K 50/80 | (2023.01) | |
| H10K 50/842 | (2023.01) | |
| H10K 50/86 | (2023.01) | |
| H10K 71/00 | (2023.01) | |

(52) U.S. Cl.
CPC ............ *H10K 50/868* (2023.02); *G02B 5/30* (2013.01); *G02B 5/3025* (2013.01); *H10K 50/8426* (2023.02); *H10K 50/8428* (2023.02); *H10K 50/86* (2023.02); *H10K 71/00* (2023.02)

(58) Field of Classification Search
CPC .................. H10K 59/8793; H10K 50/868
See application file for complete search history.

(56) References Cited

U.S. PATENT DOCUMENTS

| 11,068,089 B1* | 7/2021 | Kim ................... G06V 40/1318 |
| 11,719,872 B2* | 8/2023 | Chai ................... H04M 1/0266 |
| | | 359/483.01 |
| 2012/0106063 A1* | 5/2012 | Mathew ............... G06F 1/1686 |
| | | 349/110 |
| 2018/0315357 A1* | 11/2018 | Nam ..................... H10K 50/868 |
| 2019/0212788 A1* | 7/2019 | Kwak ..................... G06F 3/041 |
| 2021/0193756 A1* | 6/2021 | Oh ......................... H10K 59/122 |

(Continued)

FOREIGN PATENT DOCUMENTS

| CN | 107946341 A | * | 4/2018 | ............. H04N 23/57 |
| CN | 110061038 A | * | 7/2019 | ............. H10K 50/86 |

(Continued)

OTHER PUBLICATIONS

Machine translation, Chon, Korean Pat. Pub. No. KR2006-0057949A, translation date: Jul. 7, 2023, Espacenet, all pages. (Year: 2023).*

(Continued)

*Primary Examiner* — Victoria K. Hall
(74) *Attorney, Agent, or Firm* — F. CHAU & ASSOCIATES, LLC

(57) ABSTRACT

A display device may include a substrate, a plurality of light emitting elements disposed on the substrate, an encapsulation substrate disposed on the light emitting elements and a polarizing layer disposed between the light emitting elements and the encapsulation substrate and including a polarization area and a non-polarization area.

19 Claims, 15 Drawing Sheets

(56) References Cited

U.S. PATENT DOCUMENTS

| | | | | |
|---|---|---|---|---|
| 2021/0265596 A1* | 8/2021 | Lou | ...................... | H10K 50/822 |
| 2021/0280825 A1* | 9/2021 | Beon | ...................... | H10K 59/65 |
| 2021/0389514 A1* | 12/2021 | Chai | ................... | H10K 59/122 |

FOREIGN PATENT DOCUMENTS

| | | | | | |
|---|---|---|---|---|---|
| CN | 110444125 A | * | 11/2019 | ............... | G09F 9/33 |
| KR | 10-2006-0057949 A | * | 5/2006 | ........... | H10K 50/841 |
| KR | 10-0700010 | | 3/2007 | | |
| KR | 10-2011-0016345 A | * | 2/2011 | .......... | G06F 3/0412 |
| KR | 10-1074798 | | 10/2011 | | |
| KR | 10-2012-0119448 | | 10/2012 | | |
| KR | 10-1197370 | | 10/2012 | | |
| KR | 10-2017-0055014 | | 5/2017 | | |
| KR | 10-1828712 | | 2/2018 | | |

OTHER PUBLICATIONS

Machine translation, Lee, Korean Pat. Pub. No. KR10-2011-0016345A, translation date: Jul. 7, 2023, Espacenet, all pages. (Year: 2023).*

Machine translation, Ma, Chinese Pat. Pub. No. CN110061038A, translation date: Oct. 5, 2023, Espacenet, all pages. (Year: 2023).*

Machine translation, Yan, Chinese Pat. Pub. No. CN110444125A, translation date: Oct. 5, 2023, Espacenet, all pages. (Year: 2023).*

Machine translation, Yu, Chinese Pat. Pub. No. CN107946341A, translation date: Oct. 5, 2023, Espacenet, all pages. (Year: 2023).*

* cited by examiner

DISPLAY DEVICE AND METHOD OF MANUFACTURING THE SAME

CROSS-REFERENCE TO RELATED APPLICATION(S)

This application claims priority under 35 USC § 119 to Korean Patent Application No. 10-2020-0151538, filed on Nov. 13, 2020, in the Korean Intellectual Property Office (KIPO), the entire disclosure of which is incorporated by reference herein.

BACKGROUND

1. Field

One or more embodiments described herein relate to a display device and a method of manufacturing a display device.

2. Description of the Related Art

A variety of displays have been developed. Examples include organic light-emitting displays, quantum-dot organic light-emitting displays, quantum-dot nano light-emitting displays, and liquid crystal displays. Many of these displays have cameras and other functional modules of interest to users. The cameras are located in non-display areas. This increases the size of the displays or their host devices. Other functional modules integrated into the displays also have substantially the same effect.

SUMMARY

In accordance with one or more embodiments, a display device may include a substrate, a plurality of light emitting elements on the substrate, an encapsulation substrate on the light emitting elements, and a polarizing layer between the light emitting elements and the encapsulation substrate and including a polarization area and a non-polarization area.

In accordance with one embodiment, the polarization area may include a first polarization area, and a second polarization area spaced apart from the first polarization area by the non-polarization area.

In accordance with one embodiment, the light emitting elements may overlap the first polarization area and the second polarization area.

In accordance with one embodiment, the non-polarization area may include first to (n−1)-th non-polarization areas spaced apart from each other, (where n is a natural number of 3 or more), and the polarization area may include first to (n)-th polarization areas spaced apart from each other by each of the first to (n−1)-th non-polarization areas.

In accordance with one embodiment, the light emitting elements may overlap the first to (n)-th polarization areas.

In accordance with one embodiment, the display device may further include an adhesive layer disposed on the encapsulation substrate and a window layer disposed on the adhesive layer.

In accordance with one embodiment, the display device may further include a seal between the substrate and the encapsulation substrate. The seal may include a material to bond the substrate and the encapsulation substrate, and forms a space between the substrate and the encapsulation substrate.

In accordance with one embodiment, the substrate may include a base substrate including rigid material and a transistor disposed on the base substrate and electrically connected to the light emitting elements.

In accordance with one embodiment, the display device may further include a functional area disposed under the substrate and overlapping the non-polarization area. The functional area may include at least one of a camera, a face recognition sensor, a pupil recognition sensor, an acceleration sensor, a proximity sensor, an infrared sensor, an illuminance sensor, or a light sensor.

In accordance with one or more embodiments, a method of manufacturing a display device may include forming a plurality of light emitting elements on a substrate, forming an encapsulation substrate on the light emitting elements, forming a polarizing layer on the encapsulation substrate, forming a polarization area and a non-polarization area in the polarizing layer by bleaching the polarizing layer, bonding the encapsulation substrate and the substrate so that the polarizing layer faces the substrate and forms a space between the encapsulation substrate and the substrate by a seal, and disposing a functional area under the substrate to overlap the non-polarization area.

In accordance with one embodiment, after forming the polarization area and the non-polarization area on the polarizing layer, the encapsulation substrate and the substrate may be bonded together.

In accordance with one embodiment, in forming the polarization area and the non-polarization area in the polarizing layer, the non-polarization area may be formed by irradiating a laser having a wavelength of about 100 nm to about 1000 nm in the polarizing layer.

In accordance with one embodiment, in forming the polarization area and the non-polarization area in the polarizing layer, the method may include treating the polarizing layer with a chemical material to form the non-polarization area.

In accordance with one embodiment, the chemical material may include a basic material.

In accordance with one embodiment, forming the polarization area and the non-polarization area in the polarizing layer may include irradiating the polarizing layer with a laser having a wavelength of about 100 nm to about 1000 nm and after irradiating the laser, forming the non-polarization area in the polarizing layer by treating an area to which the laser is irradiated with a chemical material.

In accordance with one embodiment, the chemical material may include a neutral material.

In accordance with one embodiment, after bonding the encapsulation substrate and the substrate, forming the polarization area and the non-polarization area in the polarizing layer.

In accordance with one embodiment, in forming the polarization area and the non-polarization area in the polarizing layer, the non-polarization area may be formed by irradiating a laser having a wavelength of about 100 nm to about 1000 nm in the polarizing layer.

In accordance with one embodiment, the method may further include disposing an adhesive layer on the encapsulation substrate and disposing a window layer on the adhesive layer.

In accordance with one or more embodiments, a display device includes a substrate, a plurality of light emitting elements disposed on the substrate, an encapsulation substrate disposed on the light emitting elements, a polarizing layer between the light emitting elements and the encapsulation substrate and including a polarization area and a non-polarization area, and a functional area under the substrate and overlapping the non-polarization area. The polarization area includes a first polarization area and a second polarization area spaced apart from the first polarization area by the non-polarization area. The light emitting elements overlap the first polarization area and the second polarization area. The substrate includes a base substrate including rigid material and a transistor on the base substrate and electrically connected to the light emitting elements.

BRIEF DESCRIPTION OF THE DRAWINGS

Illustrative, non-limiting embodiments will be more clearly understood from the following detailed description taken in conjunction with the accompanying drawings.

DETAILED DESCRIPTION OF THE EMBODIMENTS

Hereinafter, embodiments of display device and a method of manufacturing the display device are explained with reference to the accompanying drawings.

Figure 1:
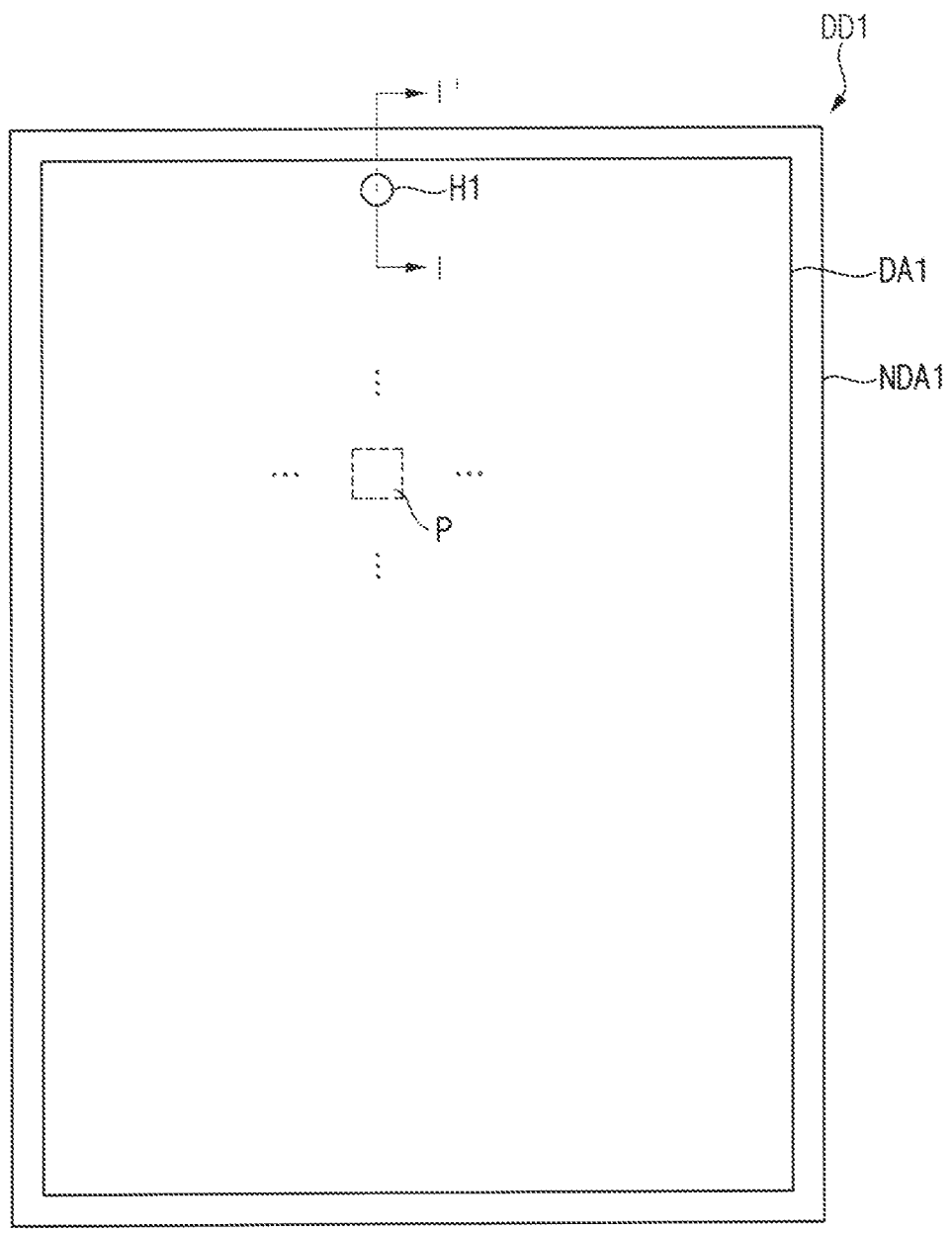
FIG. 1 illustrates an embodiment of a display device.

FIG. 1 is a plan view illustrating an embodiment of a display device DD1, which may include a display area DA1 and a non-display area NDA1. The display device DD1 may include a hole area H1 in the display area DAL An image may not be displayed in the hole area HE Accordingly, the hole area H1 may be visually recognized from an external view. In embodiments, the hole area H1 may overlap a non-polarization area, which, for example, may be obtained by removing polarization by applying a bleaching process to a polarizing layer.

The display area DA1 may also include a plurality of pixels P that emit or output light. For example, each of the pixels P may include a light emitting element that emits light and a transistor connected to the light emitting element. The light emitting element may include, for example, an organic light emitting diode, a quantum-dot organic light-emitting diode, a quantum-dot nano light-emitting diode, and the like. In one embodiment, the light emitting element may include a liquid crystal layer.

The display device DD1 may display an image based on light from the pixels P. The pixels P may be disposed in the display area DA1 according to various arrangements. For example, the pixels P may be arranged in a matrix form. In embodiments, the pixels P may also be disposed around the hole area HE Accordingly, the display device DD1 may also display an image in an area adjacent to the hole area H1.

Figure 2:
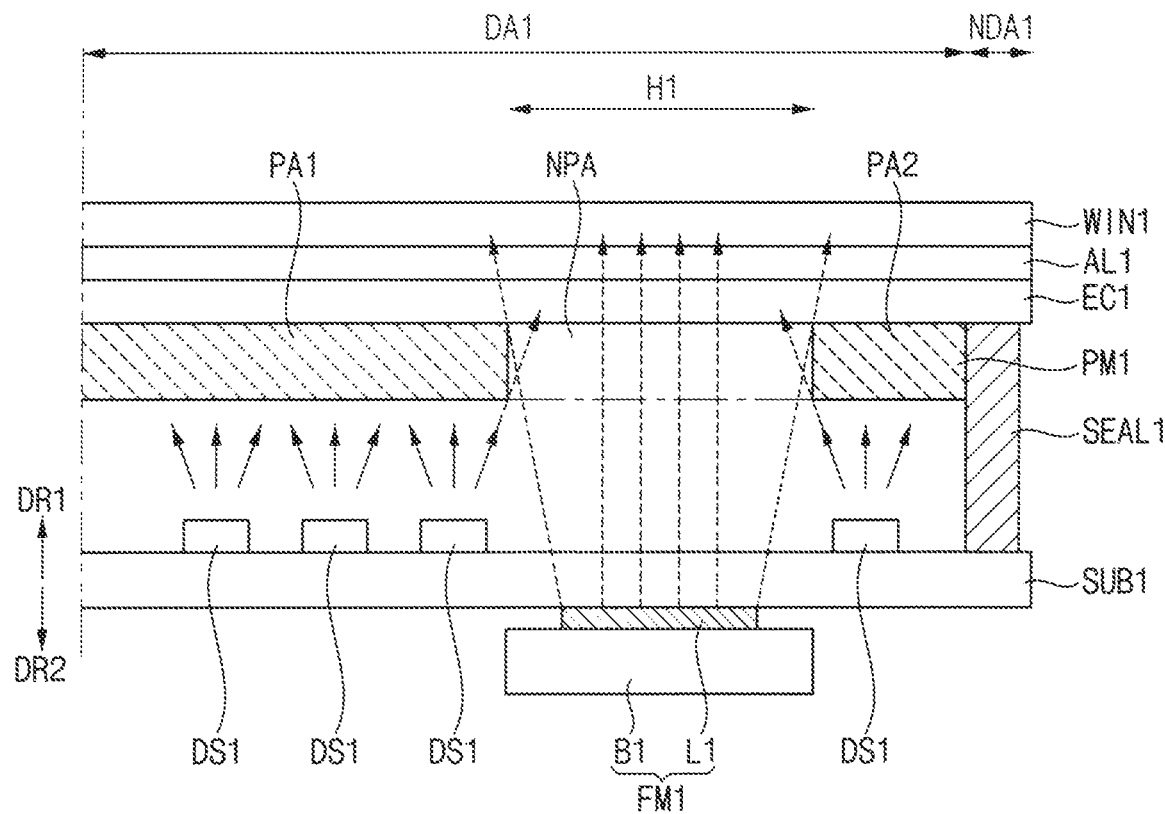
FIG. 2 illustrates a cross-sectional view taken along the line I-I' in FIG. 1.
Figure 3:
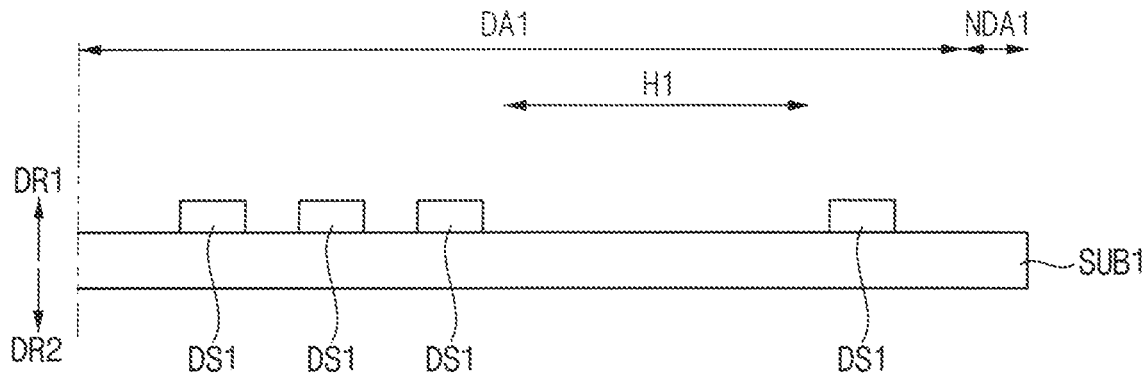
FIGS. 3 to 8 illustrate various stages included in an embodiment of a process of manufacturing a display device.

FIG. 2 is a cross-sectional view illustrating an embodiment of the display device of FIG. 1 cut along the line I-I'. Referring to FIGS. 1 and 2, the display device DD1 may include a substrate SUB1, a plurality of light emitting elements DS1, a sealing member (or seal) SEAL1, a polarizing layer PM1, an encapsulation substrate EC1, an adhesive layer ALL a window layer WIN1 and a functional module (or functional area) FM1.

In embodiments, the substrate SUB1 may include a rigid material. For example, the substrate SUB1 may include a glass material including silicon dioxide ($SiO_2$) as a main component. However, the substrate SUB1 is not limited thereto and, for example, may further include a rigid material. The substrate SUB1 may include a base substrate, a transistor on the base substrate, and a capacitor. The transistor may be connected to the light emitting element DS1 on the substrate SUB1.

The light emitting elements DS1 may be disposed on the substrate SUB1 and may be spaced apart from each other. Light generated by the light emitting devices DS1 passes through the polarizing layer PM1, the encapsulation substrate EC1, the adhesive layer AL1, and the window layer WIN1 to be emitted outside of the display device DDE In embodiments, each of the light emitting elements DS1 may emit or output light of a different color. In one embodiment, all or a predetermined number of the light emitting elements DS1 may emit or output light of a same or substantially a same color. However, this is an example, and the manner in which the light emitting elements DS1 emit or output light is not limited thereto.

The sealing member SEAL1 may be disposed in the non-display area NDA1 of the substrate SUB1. In embodiments, the sealing member SEAL1 may include frit made of glass. The sealing member SEAL1 may bond the encapsulation substrate EC1 and the substrate SUB1. To this end, an adhesive may be disposed between the sealing member SEAL1 and the substrate SUB1, and between the sealing member SEAL1 and the encapsulation substrate EC1. In addition, the sealing member SEAL1 may form a space between the substrate SUB1 and the encapsulation substrate EC1 and may serve to seal the space. For example, the sealing member SEAL1 may prevent external material from penetrating into a space formed by the substrate SUB1, the encapsulation substrate EC1, and the sealing member SEAL1. It therefore may be possible to prevent damage to the light emitting elements DS1 as a result of moisture or debris.

The encapsulation substrate EC1 may be on the substrate SUB1 and, for example, may be a glass substrate. For example, the encapsulation substrate EC1 may include a glass material including silicon dioxide ($SiO_2$) as a main component. As described above, the encapsulation substrate EC1 may be adhered to the substrate SUB1 by the sealing member SEAL1 and disposed on the substrate SUB1.

The polarizing layer PM1 may be on a bottom surface of the encapsulation substrate EC1. In embodiments, the polarizing layer PM1 may play a role of polarizing light emitted from the light emitting elements DS1. In embodiments, the polarizing layer PM1 may serve to reflect light incident from outside of the display device DDE The polarizing layer PM1 may include a polarization area and a non-polarization area. In embodiments, the polarizing layer PM1 may include a first polarization area PA1, a second polarization area PA2, and a non-polarization area NPA. The non-polarization area NPA may be formed by performing a bleaching process on a partial area of the polarizing layer PM1.

In embodiments, the bleaching process may be performed using a laser. For example, the bleaching process may be performed by irradiating the polarizing layer PM1 with a laser having a wavelength of about 100 nm to about 1000 nm. An area irradiated with the laser in the polarizing layer PM1 may be changed into the non-polarization area NPA. In embodiments, the bleaching process may be performed using a chemical material. For example, the bleaching process may be performed by treating the polarizing layer PM1 with a basic material (e.g., basic solution). An area treated with the basic solution in the polarizing layer PM1 may be changed to a non-polarization area NPA.

In embodiments, the bleaching process may be performed using a laser and a chemical material. For example, the bleaching process may be performed by treating the irradiated region with a neutral material (e.g., neutral solution), after irradiating a laser having a wavelength of about 100 nm to about 1000 nm to the polarizing layer PM1.

By forming the non-polarization area NPA in the polarizing layer PM1, the first polarizing area PA1 and second polarizing area PA2 (which is spaced apart from the first polarization area PA1 by non-polarization area NPA) may be formed in polarizing layer PM1.

In embodiments, the light emitting elements DS1 may not overlap the non-polarization area NPA. However, some of the light emitting elements DS1 may be disposed in an area adjacent to the non-polarization area NPA. In this case, light emitted by some of the light emitting elements DS1 in an area adjacent to the non-polarization area NPA may pass through the non-polarization area NPA. Accordingly, light emitted by some of the light emitting elements DS1 may be visually recognized from the outside.

In some proposed arrangements, a polarizing layer is disposed on an encapsulation substrate. Accordingly, the light paths from light emitting elements to a window layer is long. As a result, the displayed image is distorted in an area adjacent to a non-polarization area. In contrast, in accordance with one or more embodiments of the inventive concept, the polarizing layer PM1 is disposed on a bottom surface of the encapsulation substrate EC1. As a result, the light paths from the light emitting elements DS1 to the window layer WIN1 may be relatively shortened. For example, when the polarizing layer PM1 is on the bottom surface of the encapsulation substrate EC1, the width of the display device DD1 in a first direction DR1 may be reduced. Accordingly, the degree of distortion of an image in the area adjacent to the non-polarization area NPA may be reduced or eliminated.

The adhesive layer AL1 may be disposed on the encapsulation substrate EC1 and may serve to bond the encapsulation substrate EC1 and the window layer WIN1. The adhesive layer AL1 may include a transparent material that transmits light. In embodiments, the adhesive layer AL1 may be formed of an optical clear resin (OCR), an optical clear adhesive (OCA), or a combination thereof. The adhesive layer AL1 may include an acrylic composition. For example, the adhesive layer AL1 may include an epoxy acrylate-based resin, a polyester acrylate-based resin, a urethane acrylate-based resin, a polybutadiene acrylate-based resin, a silicone acrylate resin, an alkyl acrylate resin, or the like, or a combination of two or more thereof. In one embodiment, the adhesive layer AL1 may include an additional material having adhesiveness.

The window layer WIN1 may be on the adhesive layer AL1 to protect the display device DD1 from outside impact, debris, or moisture.

Because the polarizing layer PM1 is under the encapsulation substrate EC1, the encapsulation substrate EC1 may serve to protect the light emitting element DS1 and the like. Accordingly, in embodiments, the adhesive layer AL1 and the window layer WIN1 may not be included. As a result, the thickness of the display device DD1 may be reduced. Accordingly, the light path from the light emitting elements DS1 to outside of the display device DD1 may be reduced. This may prevent or reduce the degree of distortion of light emitted from the light emitting elements DS1.

The functional module FM1 may be disposed on a bottom surface of the substrate SUB1. The display device FM1 may further include an accommodating member for accommodating the functional module FM1. The functional module FM1 may include a body B1 and a lens L1. The body B1 may support the lens L1. The functional module FM1 may recognize a signal, light, etc., incident from outside of the display device DD1 using lens L1.

The functional module FM1 may include, for example, at least one of a camera module, a face recognition sensor module, a pupil recognition sensor module, an acceleration sensor module, a proximity sensor module, an infrared sensor module, an illuminance sensor module, or a light sensor module.

As described above, because the polarizing layer PM1 is under the encapsulation substrate EC1, a layer gap of the display device DD1 may be reduced. For this reason, distortion that occurs when the functional module FM1 recognizes an external signal, operation, or the like may be reduced.

FIGS. 3 to 8 are diagrams illustrating various stages of an embodiment of a process of manufacturing a display device, which, for example, may be the display device of FIG. 1.

Figure 8:
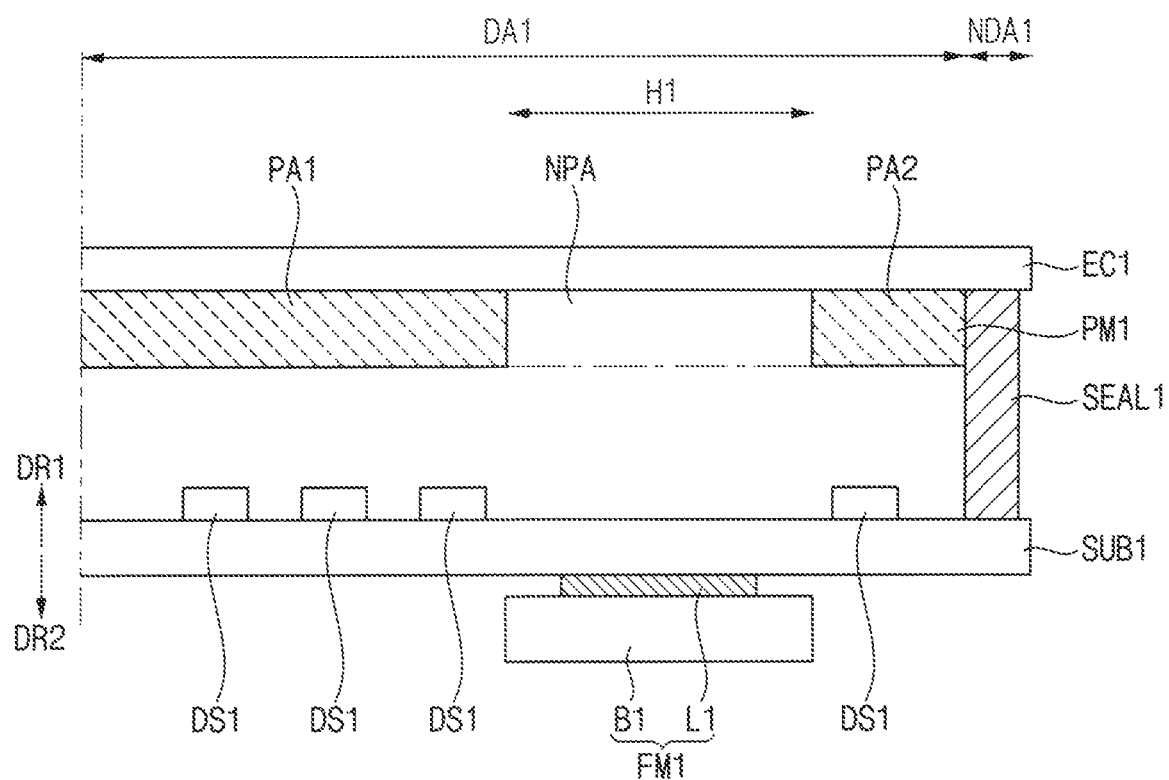

Referring to FIGS. 1 and 8, the substrate SUB1 may be prepared to manufacture the display device DD1. The substrate SUB1 may include a rigid material. For example, the substrate SUB1 may include a glass material including silicon dioxide ($SiO_2$). The light emitting elements DS1 may be disposed on the substrate SUB1.

Figure 4:
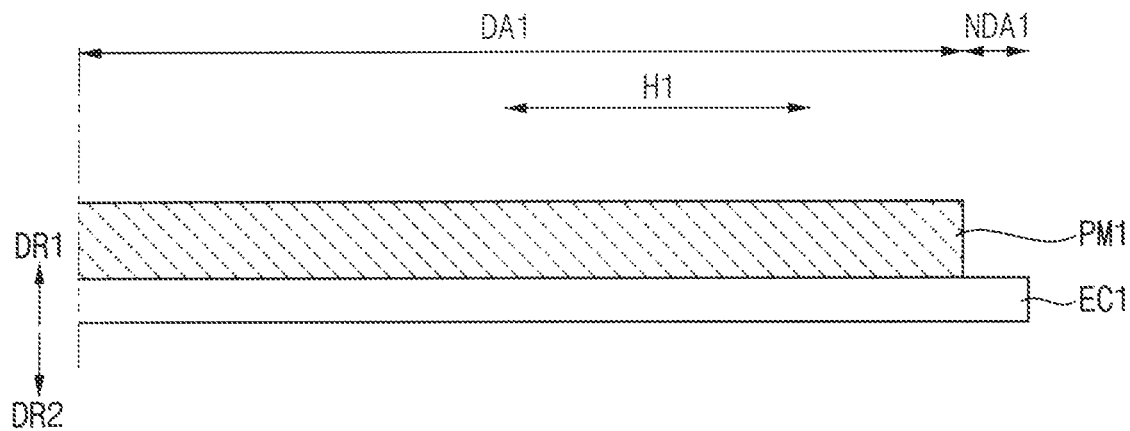

Referring to FIGS. 1 and 4, the encapsulation substrate EC1 may be prepared to manufacture the display device DD1. The encapsulation substrate EC1 may include a rigid material. The polarizing layer PM1 may be disposed on the encapsulation substrate EC1.

Figure 5:
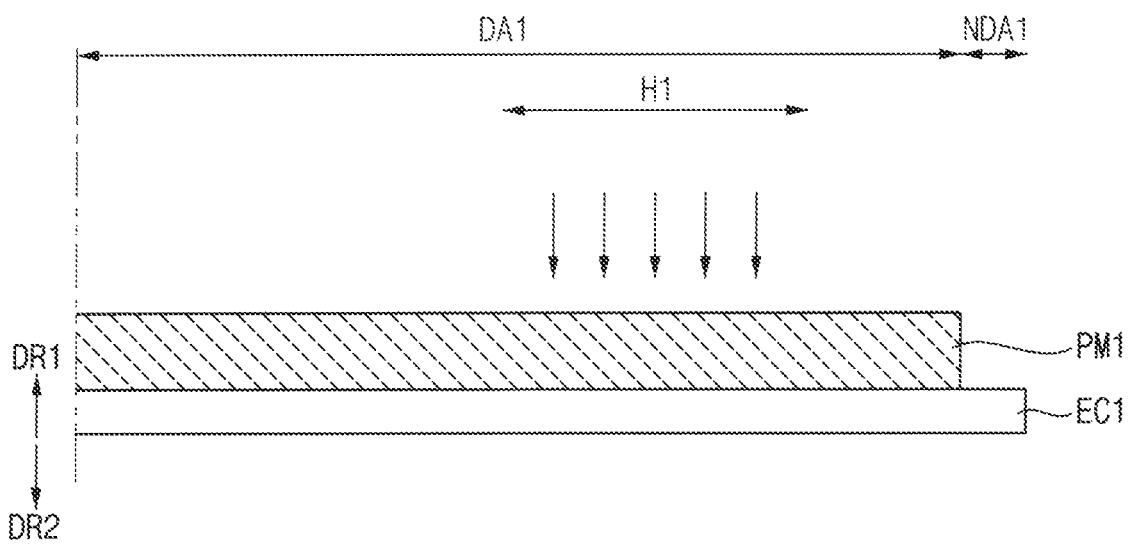
Figure 6:
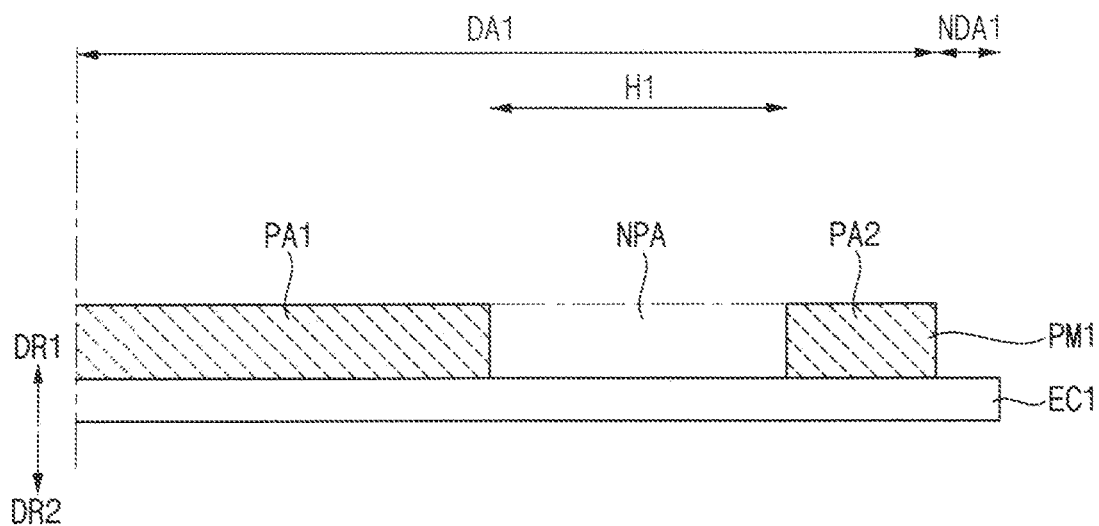

Referring to FIGS. 1, 5 and 6, the bleaching process may be performed in the polarizing layer PM1. In embodiments, the bleaching process may be performed using a laser. In one embodiment, the bleaching process may be performed using a chemical substance. In addition, the bleaching process may be performed using a laser and a chemical substance at the same or substantially the same time.

The non-polarization area NPA may be formed in the polarizing layer PM1 by the bleaching process. By forming the non-polarization area NPA, the first polarization area PA1 and the second polarization area PA2 may be formed in the polarizing layer PM1. Accordingly, the polarizing layer PM1 may selectively polarize only in the first polarization area PA1 and the second polarization area PA2 of the polarizing layer PM1.

Figure 7:
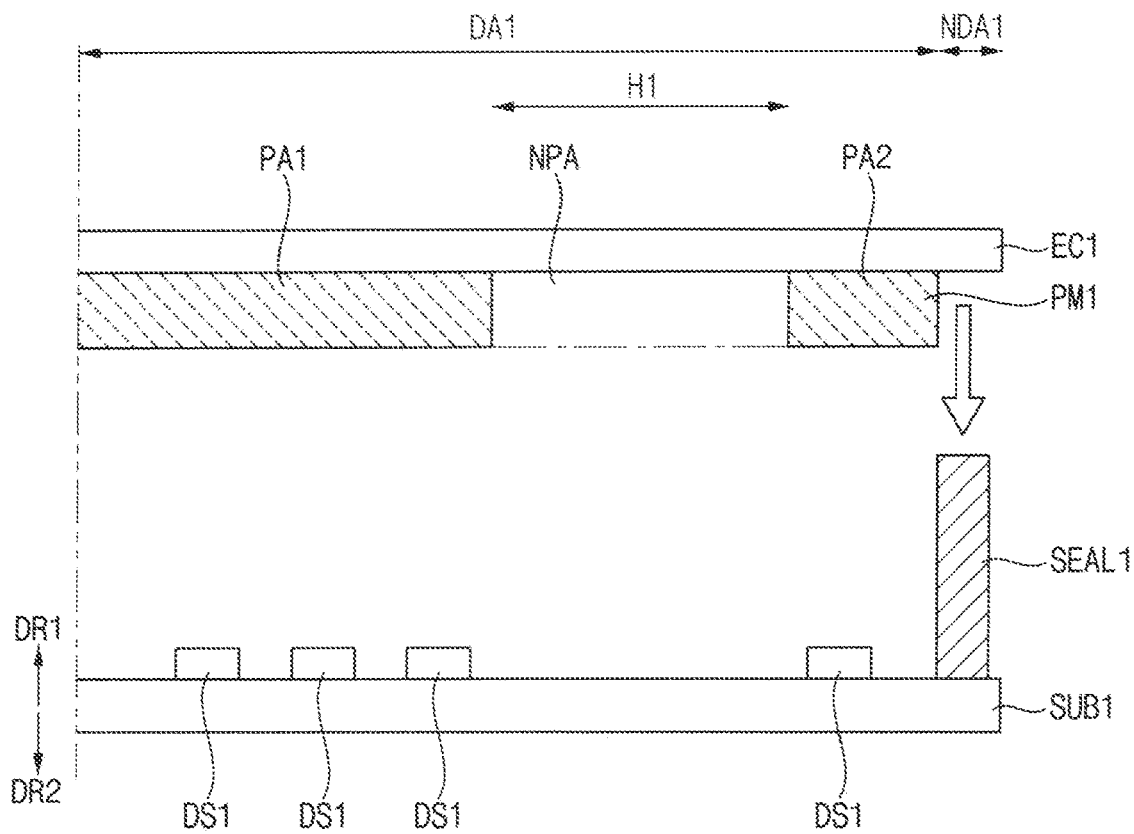

Referring to FIGS. 1, 7, and 8, the polarizing layer PM1 may be disposed on the substrate SUB1, for example, by the sealing member SEAL1. The sealing member SEAL1 may serve to prevent an external material from penetrating into the display device DD1, along with the substrate SUB1 and the encapsulation substrate EC1. In addition, a space may be formed between the substrate SUB1 and the encapsulation substrate EC1 by the sealing member SEAL1. In one or more embodiments of the inventive concept, the polarizing layer PM1 is disposed in the space formed between the substrate SUB1 and the encapsulation substrate EC1 so that a light path from the light emitting elements DS1 in the display device DD1 may be shortened. Accordingly, when the display device DD1 displays an image, it is possible to prevent or mitigate distortion of the image.

In addition, a distance from the functional module FM1 to the outside of the display device DD1 may be shortened. For example, when the functional module FM1 is the camera module, a distance from the camera module to the outside of the display device DD1 is shortened, so that an imaging path of the camera module can be effectively controlled.

Figure 9:
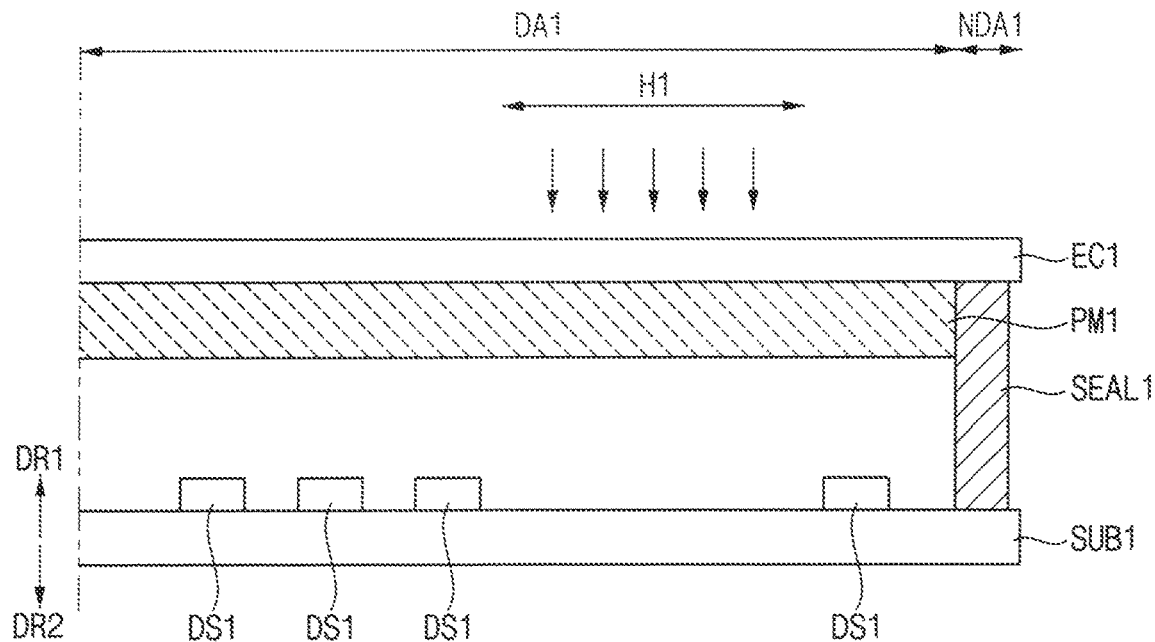
FIGS. 9 and 10 illustrate an embodiment of a process of manufacturing a display device of FIG. 1.
Figure 10:
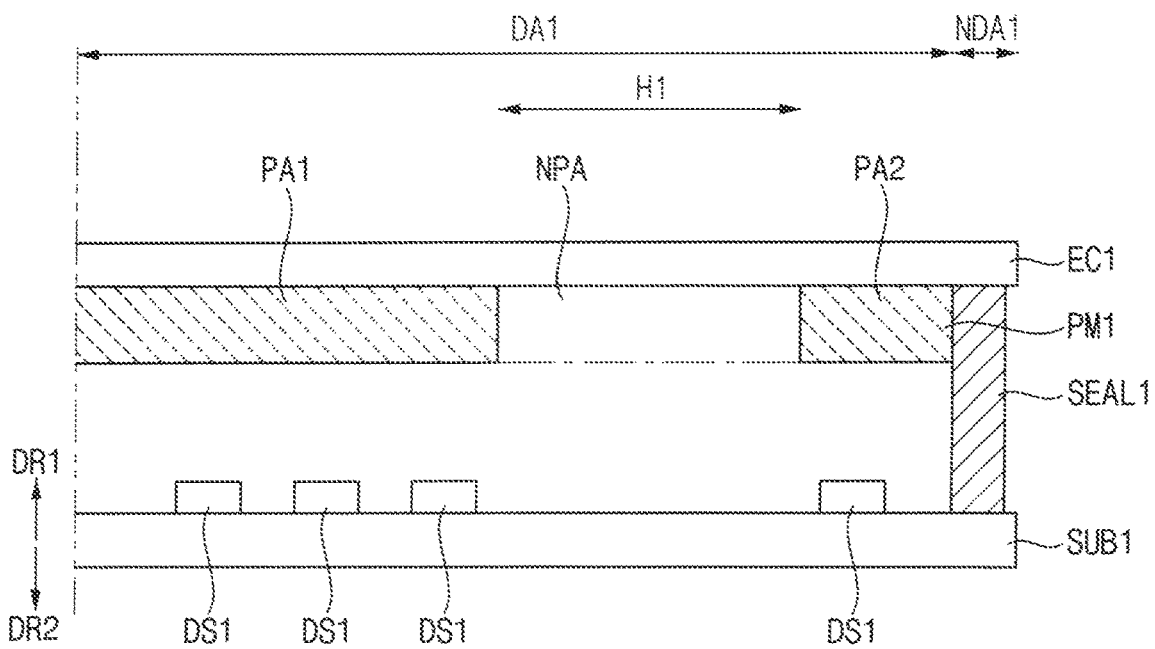

FIGS. 9 and 10 are diagrams illustrating an embodiment of a process of manufacturing the display device of FIG. 1. Referring to FIGS. 1, 9, and 10, the display device DD1 may form a polarizing layer PM1 on the encapsulation substrate EC1. Thereafter, the encapsulation substrate EC1 may be bonded to the substrate SUB1 so that the polarizing layer PM1 faces the plurality of light emitting elements DS1. In this case, the substrate SUB1 and the encapsulation substrate EC1 may be spaced apart by the sealing member SEAL1. After the substrate SUB1 and the encapsulation substrate EC1 are bonded together, the bleaching process may be performed. The bleaching process may be performed, for example, using a laser having a wavelength of about 100 nm to about 1000 nm.

Figure 11:
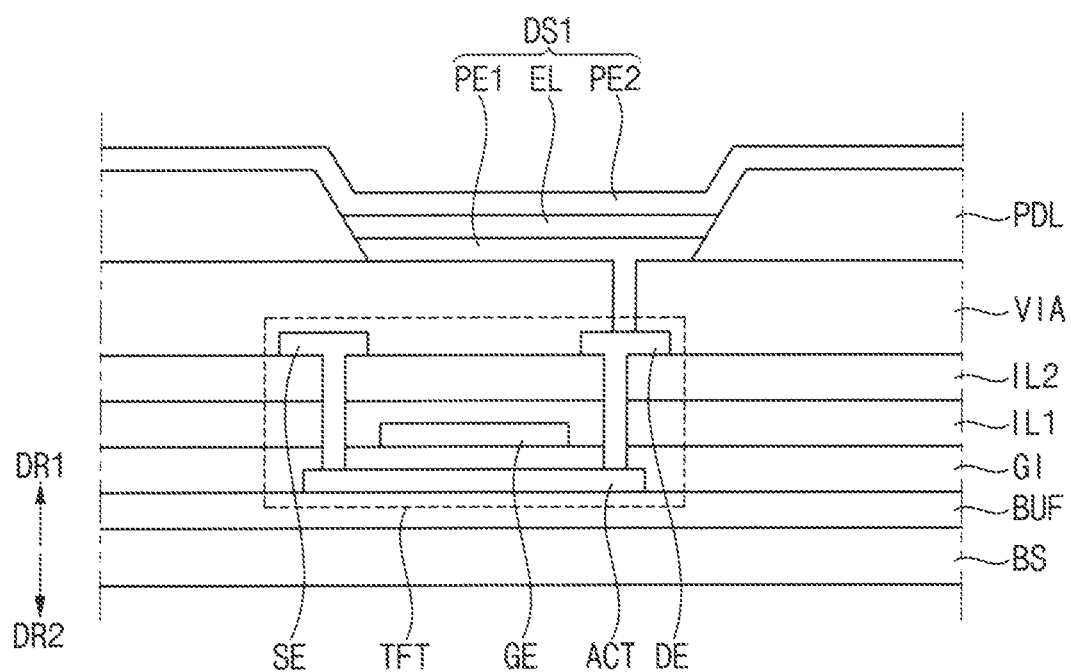
FIG. 11 illustrates an embodiment of a substrate of a display device.

FIG. 11 is a cross-sectional view illustrating an embodiment of a substrate included in the display device of FIG. 1. Referring to FIGS. 1 and 11, the display device DD1 may include a base substrate BS, a buffer layer BUF, a gate insulating layer GI, a first interlayer insulating layer ILL a second interlayer insulating layer IL2, a via insulating layer VIA, and a pixel defining layer PDL, a transistor TFT, and the light emitting element DS1. The transistor TFT may include an active layer ACT, a gate electrode GE, a source electrode SE, and a drain electrode DE. The light emitting element DS1 may include a first electrode PE1, an intermediate layer EL, and a second electrode PE2. In embodiments, the transistor TFT and the light emitting element DS1 may correspond to a pixel P that emits light of an image displayed on the display device DM. The display device DD1 may include a plurality of pixels P.

The base substrate BS may include a rigid material. For example, the base substrate BS may include a glass material including silicon dioxide ($SiO_2$). However, the base substrate BS is not limited thereto and, for example, may further include a rigid material.

The buffer layer BUF may be disposed on the base substrate BS to planarize the surface of the base substrate BS, to allow the transistor TFT to be disposed. In addition, the buffer layer BUF may prevent foreign substances from penetrating into the transistor TFT from the base substrate BS.

The active layer ACT may be disposed on the buffer layer BUF and may serve as a channel of the transistor TFT. In one embodiment, the active layer ACT may include an oxide-based semiconductor material. In one embodiment, the active layer ACT may include a silicon-based semiconductor material. In one embodiment, the display device DD1 may include a plurality of active layers ACT, one or more of which may include an oxide-based semiconductor material. In this case, remaining ones of the active layers ACT may include a silicon-based semiconductor material. Ends of the active layer ACT may include impurities.

The gate insulating layer GI may cover the active layer ACT and may be disposed on the buffer layer BUF. The gate insulating layer GI may insulate the active layer ACT and the gate electrode GE. For example, the gate insulating layer GI may include an insulating material such as silicon nitride, silicon oxide, or silicon oxynitride.

The gate electrode GE may be disposed on the gate insulating layer GI and may include a conductive material. The gate electrode GE may overlap the active layer ACT and may be spaced apart from the active layer ACT. When a gate signal is applied to the gate electrode GE, various signals may flow through the active layer ACT.

The first interlayer insulating layer IL1 may cover the gate electrode GE and may be disposed on the gate insulating layer GI. The first interlayer insulating layer IL1 may serve to insulate the gate electrode GE and electrodes (e.g., a capacitance electrode) disposed on the first interlayer insulating layer IL1. For example, the first interlayer insulating layer IL1 may include an insulating material such as silicon nitride, silicon oxide, or silicon oxynitride.

The second interlayer insulating layer IL2 may be disposed on the first interlayer insulating layer IL1 and may include an insulating material such as silicon nitride, silicon oxide, or silicon oxynitride.

The source electrode SE and the drain electrode DE may be disposed on the second interlayer insulating layer IL2. Signals transmitted through the source electrode SE may flow to the drain electrode DE through the active layer ACT. For example, a driving signal for driving the light emitting element DS1 may be transmitted to the light emitting element DS1 through the source electrode SE, the active layer ACT, and the drain electrode DE.

The via insulating layer VIA may be disposed on the second interlayer insulating layer IL2 to cover the source electrode SE and the drain electrode DE. The via insulating layer VIA may have a flat top surface on which the light emitting element DS1 is disposed. The via insulating layer VIA may include an organic material.

The first electrode PE1 may be disposed on the via insulating layer VIA and may include a conductive material. In embodiments, the first electrode PE1 may operate as an anode electrode. The first electrode PE1 may be connected to the drain electrode DE through a contact hole formed by removing a part of the via insulating layer VIA. For example, the light emitting element DS1 may be connected to the transistor TFT.

The intermediate layer EL may be disposed on the first electrode PE1 and may emit light. In embodiments, the intermediate layer EL may have a structure in which at least one layer is stacked. For example, the intermediate layer EL may have a structure in which a hole injection layer, a hole transport layer, a light emitting layer, an electron transport layer, an electron injection layer, and the like are stacked.

The second electrode PE2 may be disposed on the intermediate layer EL and cover the pixel defining layer PDL. The second electrode PE2 may include a conductive material. In embodiments, the second electrode PE2 may operate as a cathode electrode. In one embodiment, the second electrode PE2 may operate as a common electrode connected to the other light emitting element DS1. The pixel defining layer PDL may be disposed on the via insulating layer VIA and may serve to distinguish the plurality of light emitting elements DS1 from each other.

Figure 12:
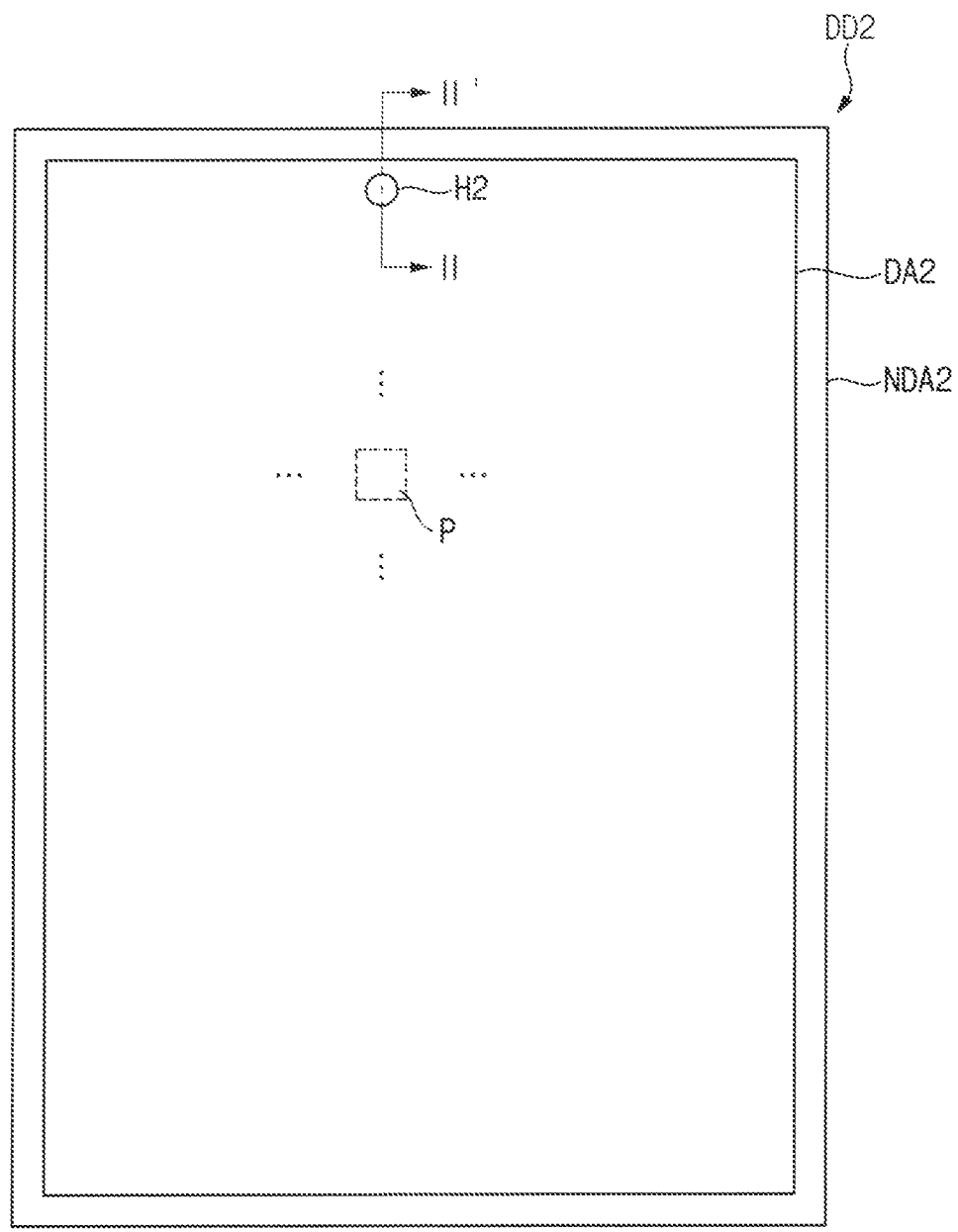
FIG. 12 illustrates an embodiment of a display device.

FIG. 12 is a plan view illustrating an embodiment of a display device DD2, which may include a display area DA2 and a non-display area NDA2. The display device DD2 may include a hole area H2 in the display area DA2 of the display device DD2. The display device DD2 may have an under panel camera (UPC) structure having the hole area H2 in the display area DA2. In this case, the hole area H2 may not be visually recognized from the outside. The display device DD2 may display an image based on light from the pixels P. The pixels P may be disposed in the display area DA2. Some of the pixels P may be disposed in the hole area H2. Accordingly, the display device DD2 may display an image in an area adjacent to the hole area H2 and in the hole area H2.

Figure 13:
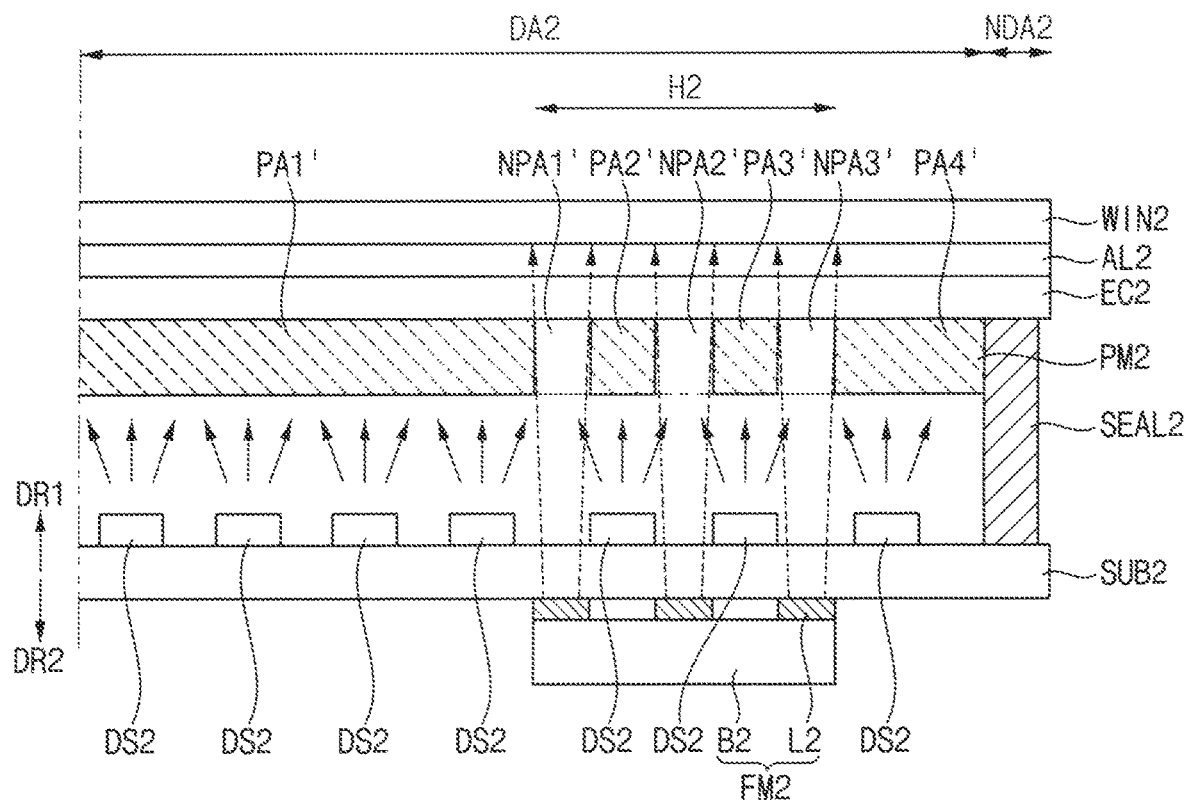
FIG. 13 illustrates a view taken along line II-II' of FIG. 12.
Figure 14:
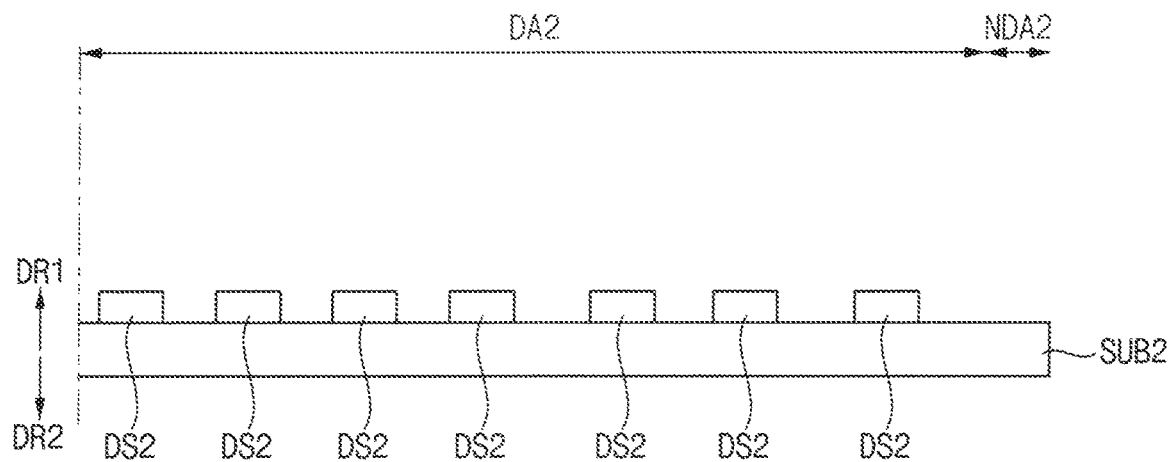
FIGS. 14 to 19 illustrate various stages included in an embodiment of a process of manufacturing a display device.
Figure 15:
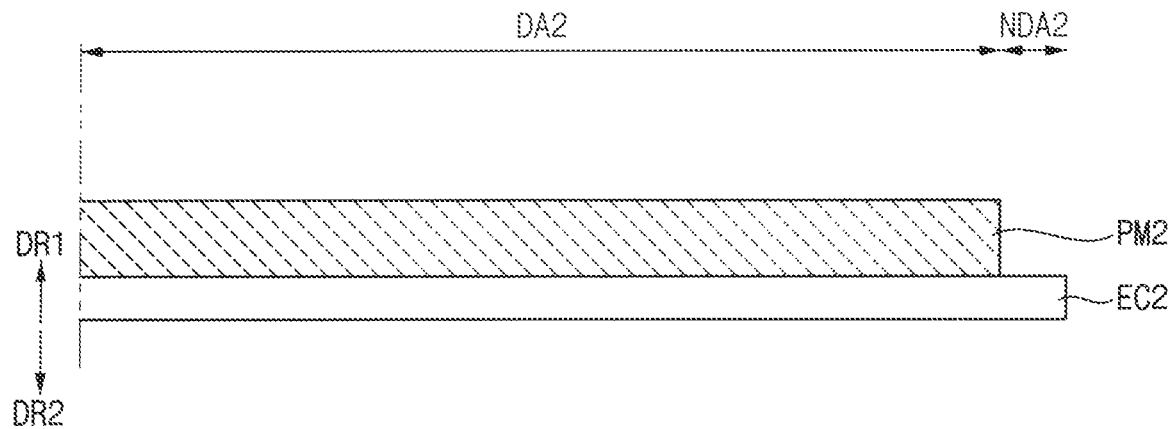
Figure 16:
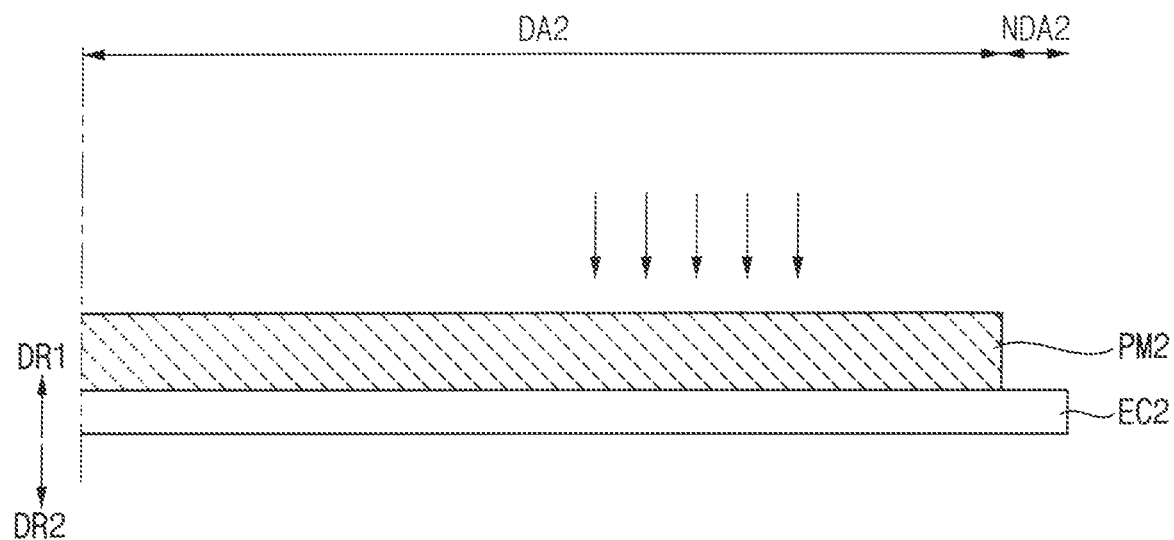
Figure 17:
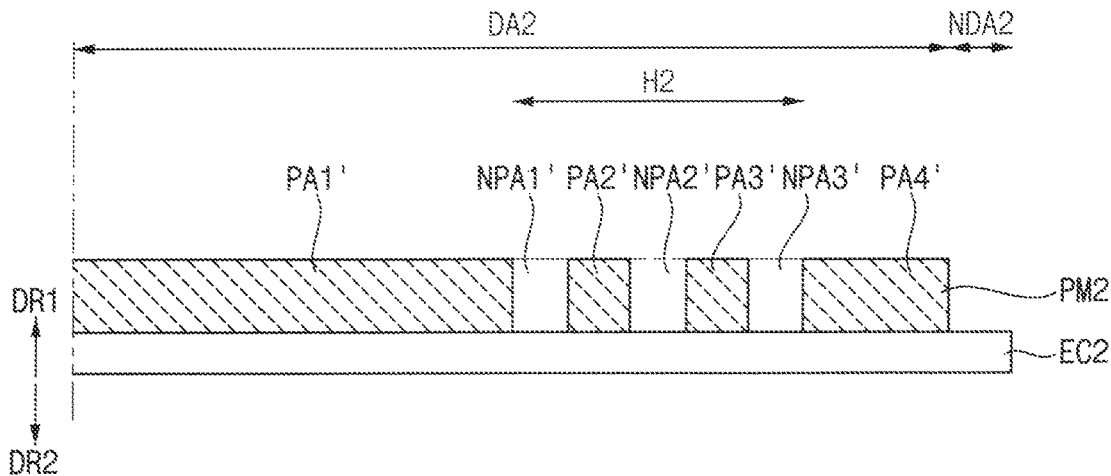
Figure 18:
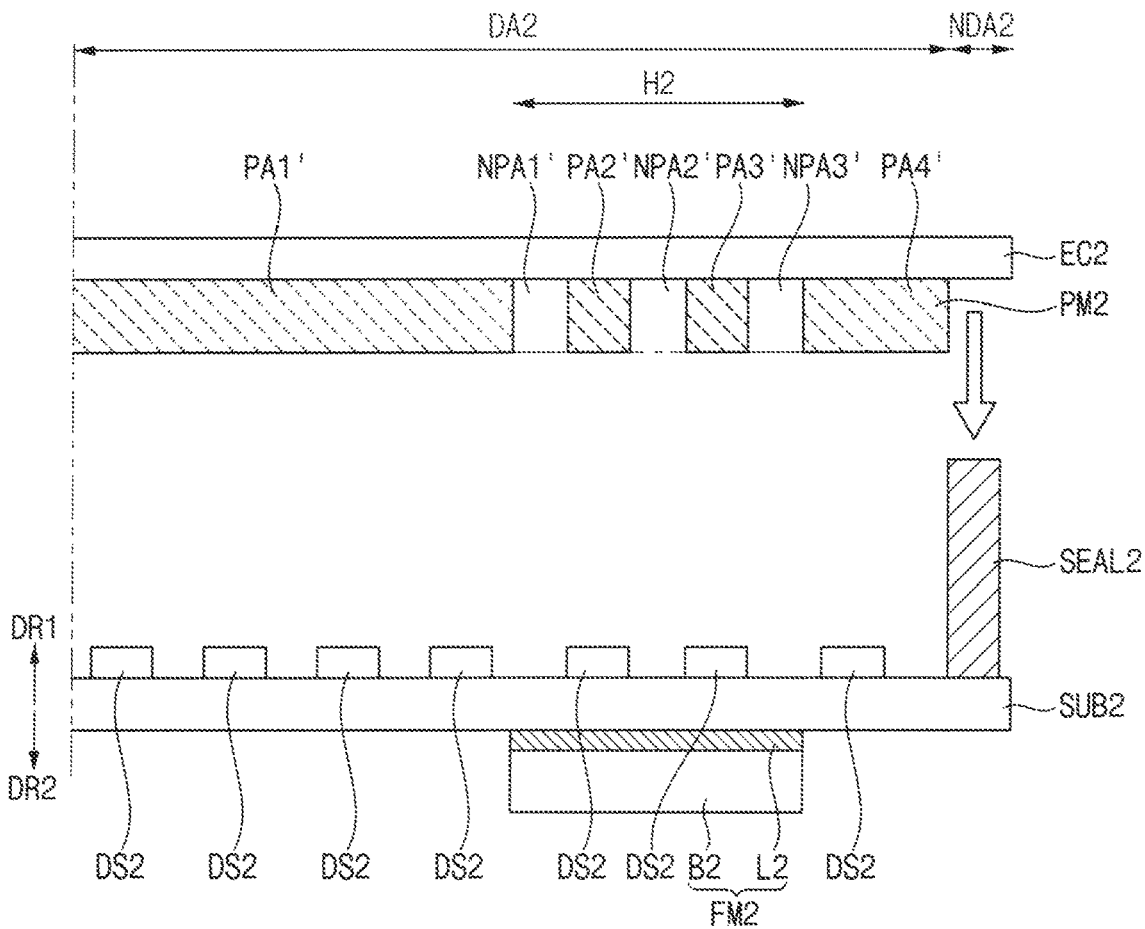
Figure 19:
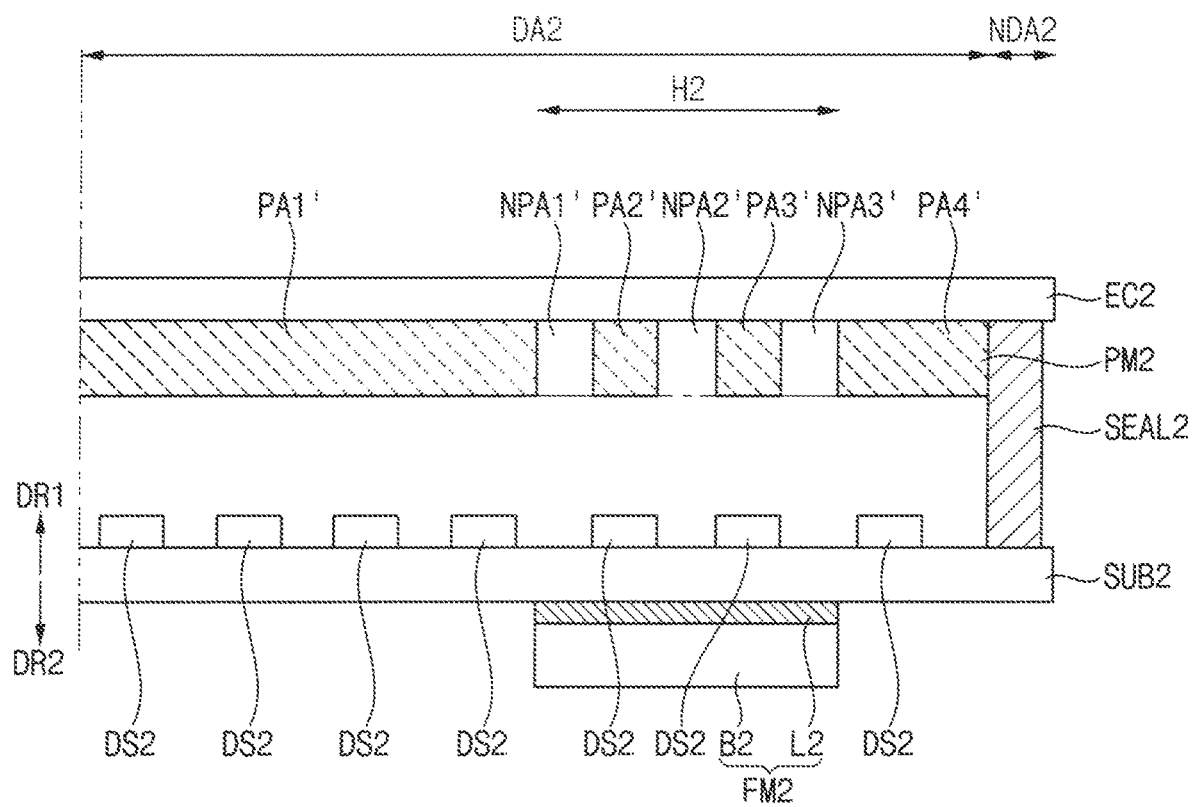

FIG. 13 is a cross-sectional view illustrating an embodiment of the display device of FIG. 12 taken along the line Referring to FIGS. 12 and 13, the display device DD2 may include a substrate SUB2, a plurality of light emitting elements DS2, a sealing member (or seal) SEAL2, a polarizing layer PM2, an encapsulation substrate EC2, an adhesive layer AL2, a window layer WIN2, and a functional module (or functional area) FM2.

In embodiments, the substrate SUB2 may include a rigid material. For example, the substrate SUB2 may include a glass material including silicon dioxide ($SiO_2$) as a main component or may include a resin such as reinforced plastic. The substrate SUB2 may include a transistor and a capacitor.

The light emitting elements DS2 may be on the substrate SUB2 and spaced apart from each other. Light from the light emitting elements DS2 may pass through the polarizing layer PM2, the encapsulation substrate EC2, the adhesive layer AL2, and the window layer WIN2 to be emitted outside. In embodiments, the light emitting elements DS2 may emit light of various colors. For example, each of the light emitting elements DS2 may emit red, blue, and green light. In addition, the light emitting elements DS2 may emit light of different colors, or all or a predetermined number of the light emitting elements DS2 may emit light of the same color. However, the manner in which the plurality of light emitting elements DS2 may emit light is not limited thereto.

The sealing member SEAL2 may be disposed in the non-display area NDA2 of the substrate SUB2. In embodiments, the sealing member SEAL2 may include frit made of glass. The sealing member SEAL2 may bond the encapsulation substrate EC2 and the substrate SUB2. In addition, the sealing member SEAL2 may form a space between the substrate SUB2 and the encapsulation substrate EC2 and may serve to seal the space. For example, the sealing member SEAL2 may prevent an external material from penetrating into the space formed by the substrate SUB2, the encapsulation substrate EC2, and the sealing member SEAL2.

The encapsulation substrate EC2 may be disposed on the substrate SUB2 and, for example, may be a glass substrate. For example, the substrate may include a glass material including silicon dioxide ($SiO_2$) as a main component. As described above, the encapsulation substrate EC2 may be bonded with the substrate SUB2 by the sealing member SEAL2 and thus disposed on the substrate SUB2.

The polarizing layer PM2 may be disposed on a bottom surface of the encapsulation substrate EC2. In embodiments, the polarizing layer PM2 may serve to polarize light emitted from the light emitting elements DS2. In embodiments, the polarizing layer PM2 may serve to reflect light incident from outside of the display device DD2.

The polarizing layer PM2 may include a polarization area and a non-polarization area. In embodiments, the polarizing layer PM2 may include first to fourth polarization areas PA1', PA2', PA3', PA4' spaced apart from each other, and first to third non-polarization areas NPA1', NPA2', NPA3' spaced apart from each other. The first to fourth polarization areas PA1', PA2', PA3', PA4' may be spaced apart from each other by first to third non-polarization areas NPA1', NPA2', NPA3'.

In FIG. 13, the polarizing layer PM2 is illustrated to include four polarization areas PA1', PA2', PA3', PA4' and three non-polarization areas NPA1', NPA2', NPA3'. However, the polarizing layer PM2 may include a different number of polarization areas and/or a different number of non-polarization areas. For example, the polarizing layer PM2 may have n−1 non-polarization areas spaced apart from each other and n polarization areas spaced apart from each other by the non-polarization areas (where n is a natural number of 3 or more).

The first to third non-polarization areas NPA1', NPA2', NPA3' may be formed by performing the bleaching process on a partial area of the polarizing layer PM2. In embodiments, the bleaching process may be performed using a laser. In one embodiment, the bleaching process may be performed using a chemical substance. In addition, the bleaching process may be performed using a laser and a chemical substance at the same or substantially a same time. In this case, the bleaching process may be performed using the laser and then finished using the chemical substance.

In embodiments, the light emitting elements DS2 may not overlap the first to third non-polarization areas NPA1', NPA2', NPA3'. However, some of the light emitting elements DS2 may be disposed in an area adjacent to the first to third non-polarization areas NPA1', NPA2', NPA3'. In this case, light emitted by some of the light emitting elements DS2 disposed in the area adjacent to the first to third non-polarization areas NPA1', NPA2', NPA3' may pass through the first to third non-polarization areas NPA1', NPA2', NPA3'.

In some proposed arrangements, a polarizing layer is disposed on an encapsulation substrate. Accordingly, the light path from light emitting elements to a window layer is long. The long light path may distort an image in an area adjacent to one or more non-polarization areas. In contrast, in accordance with one or more embodiments of the inventive concept, polarizing layer PM2 is disposed on a bottom surface of the encapsulation substrate EC2. As a result, the light path from the light emitting elements DS2 to the window layer WIN2 may be relatively shorter. For example, when the polarizing layer PM2 is on the bottom surface of the encapsulation substrate EC2, the width of the display device DD2 in the first direction DR1 may be reduced. Accordingly, the degree of distortion of an image in the area adjacent to the first to third non-polarization area NPA1', NPA2', NPA3' may be reduced.

The adhesive layer AL2 may be disposed on the encapsulation substrate EC2. The adhesive layer AL2 may serve to bond the encapsulation substrate EC2 and the window layer WIN2. The adhesive layer AL2 may include a transparent material to transmit light. In embodiments, the adhesive layer AL2 may be formed of an optical clear resin (OCR), an optical clear adhesive (OCA), or a combination thereof. The adhesive layer AL2 may include an acrylic composition. For example, the adhesive layer AL2 may include, for example, an epoxy acrylate-based resin, a polyester acrylate-based resin, a urethane acrylate-based resin, and a polybutadiene acrylate-based resin. a silicone acrylate resin, an alkyl acrylate resin, or the like. In one embodiment, the adhesive layer AL2 may further include a material having adhesiveness.

The window layer WIN2 may be disposed on the adhesive layer AL2, for example, to protect the display device DD2 from debris and moisture from the outside.

The functional module FM2 may be disposed on a bottom surface of the substrate SUB2. The display device DD2 may further include an accommodating member for accommodating the functional module FM2. The functional module FM2 may include a body B2 and a lens L2. The body B2 may support the lens L2. The functional module FM2 may recognize a signal, light, etc., incident from outside the display device DD2 using the lens L2.

The functional module FM2 may be disposed to overlap the first to third non-polarization areas NPA1', NPA2', and NPA3'. In embodiments, the lens L2 may be disposed to overlap the first to third non-polarization areas NPA1', NPA2', and NPA3'.

The types of the functional module FM2 may be of various kinds. For example, the functional module FM2 may include at least one of a camera module, a face recognition sensor module, a pupil recognition sensor module, an acceleration sensor module, a proximity sensor module, an infrared sensor module, an illuminance sensor module, or a light sensor module.

As described above, because the polarizing layer PM2 is disposed under the encapsulation substrate EC2, a layer gap of the display device DD2 may be reduced. For this reason, distortion that occurs when the functional module FM2 recognizes an external signal, operation, or the like may be reduced or eliminated.

FIGS. 14 to 19 are diagrams illustrating various stages in an embodiment of a process of manufacturing the display device of FIG. 12. FIGS. 14 to 19 may be substantially the same as the process of manufacturing the display device of FIGS. 3 to 8, except that the number of polarization and non-polarization areas and light emitting elements are also disposed in the hole area H2.

Figure 20:
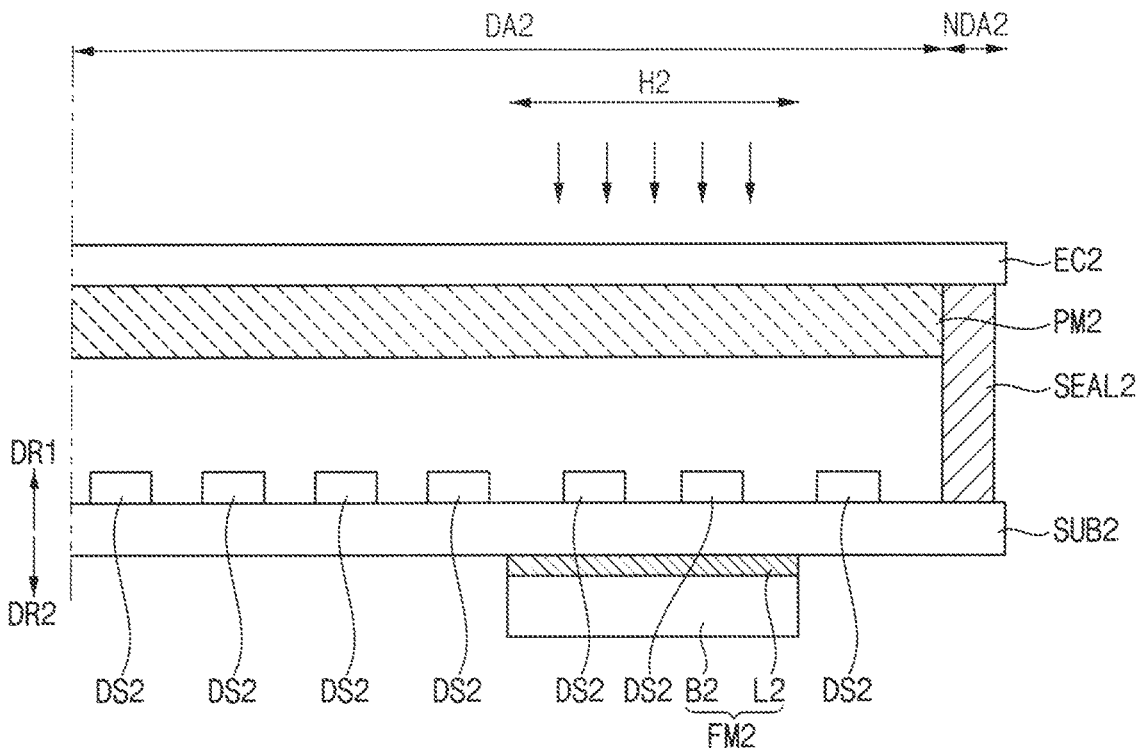
FIGS. 20 and 21 illustrate an embodiment of a process of manufacturing a display device.
Figure 21:
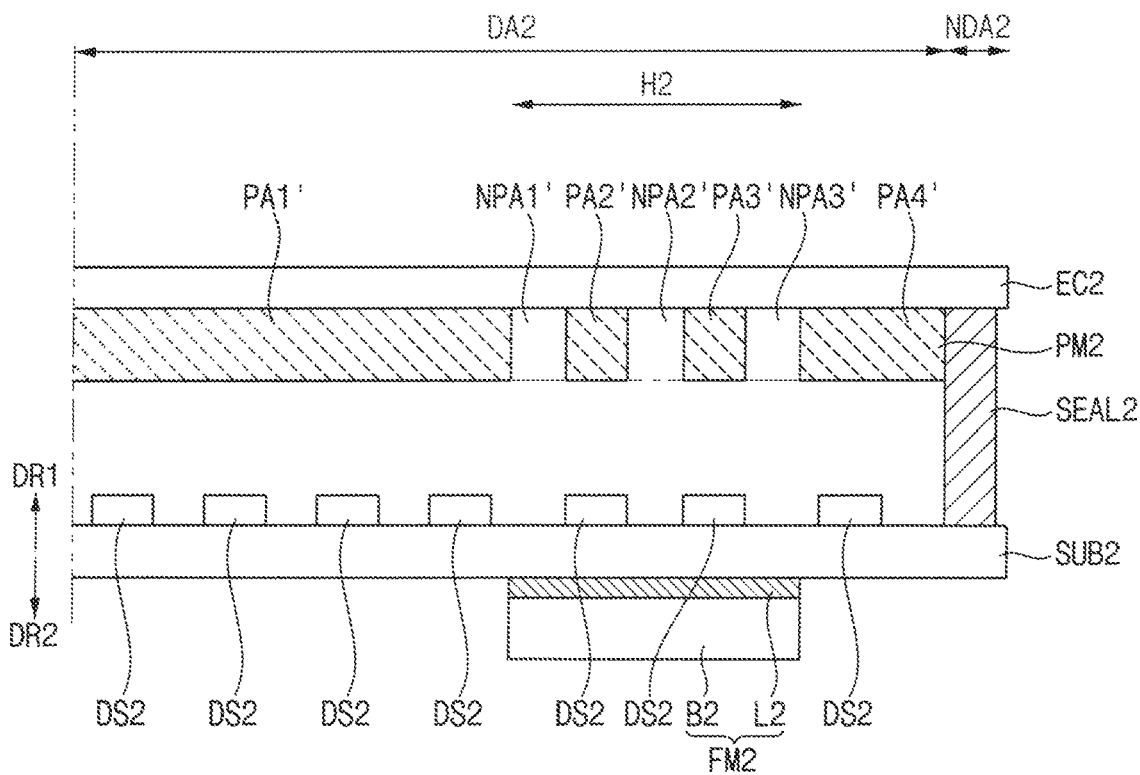

FIGS. 20 and 21 are diagrams illustrating an embodiment of a process of manufacturing the display device of FIG. 12. FIGS. 20 and 21 may be substantially the same as the process of manufacturing the display device of FIGS. 9 and 10, except that the number of polarization and non-polarization areas and light emitting elements are also disposed in the hole area H2.

Figure 22A:
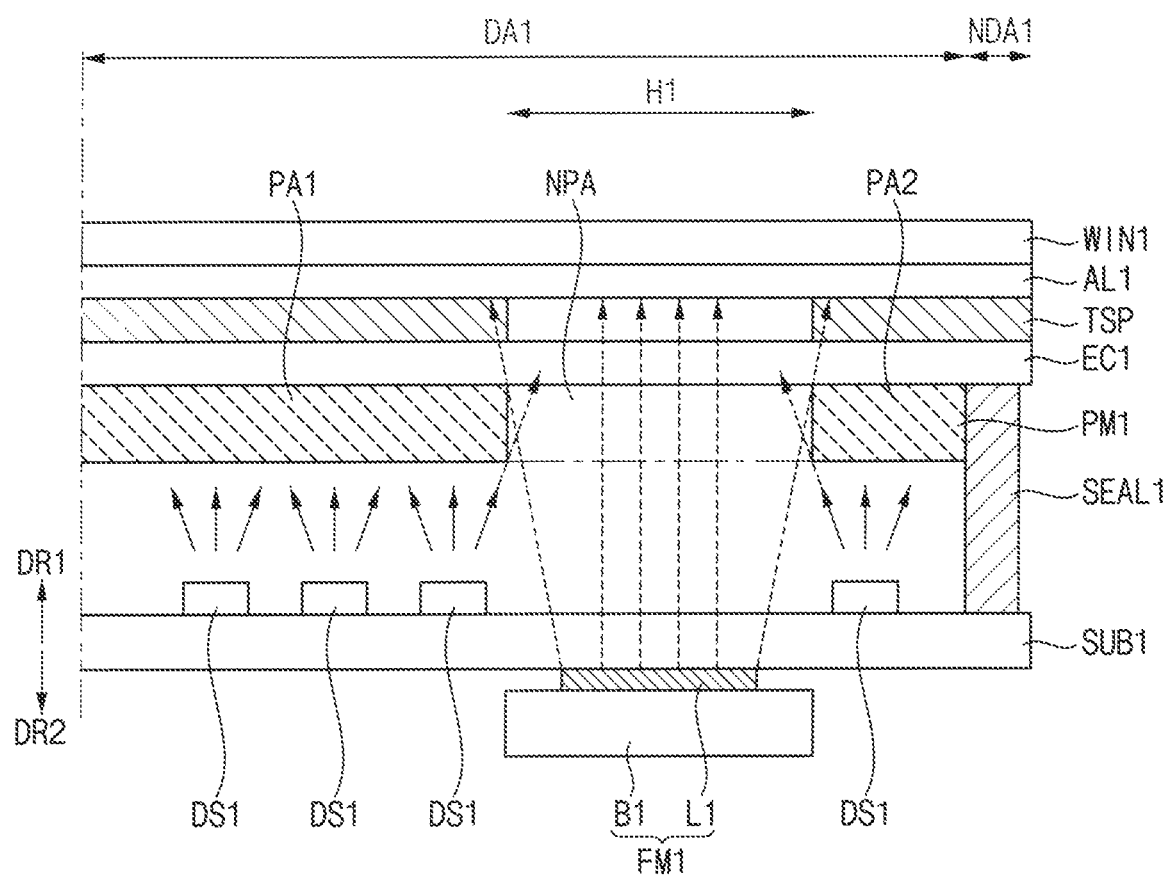
FIGS. 22A and 22B illustrate embodiments of a display device.
Figure 22B:
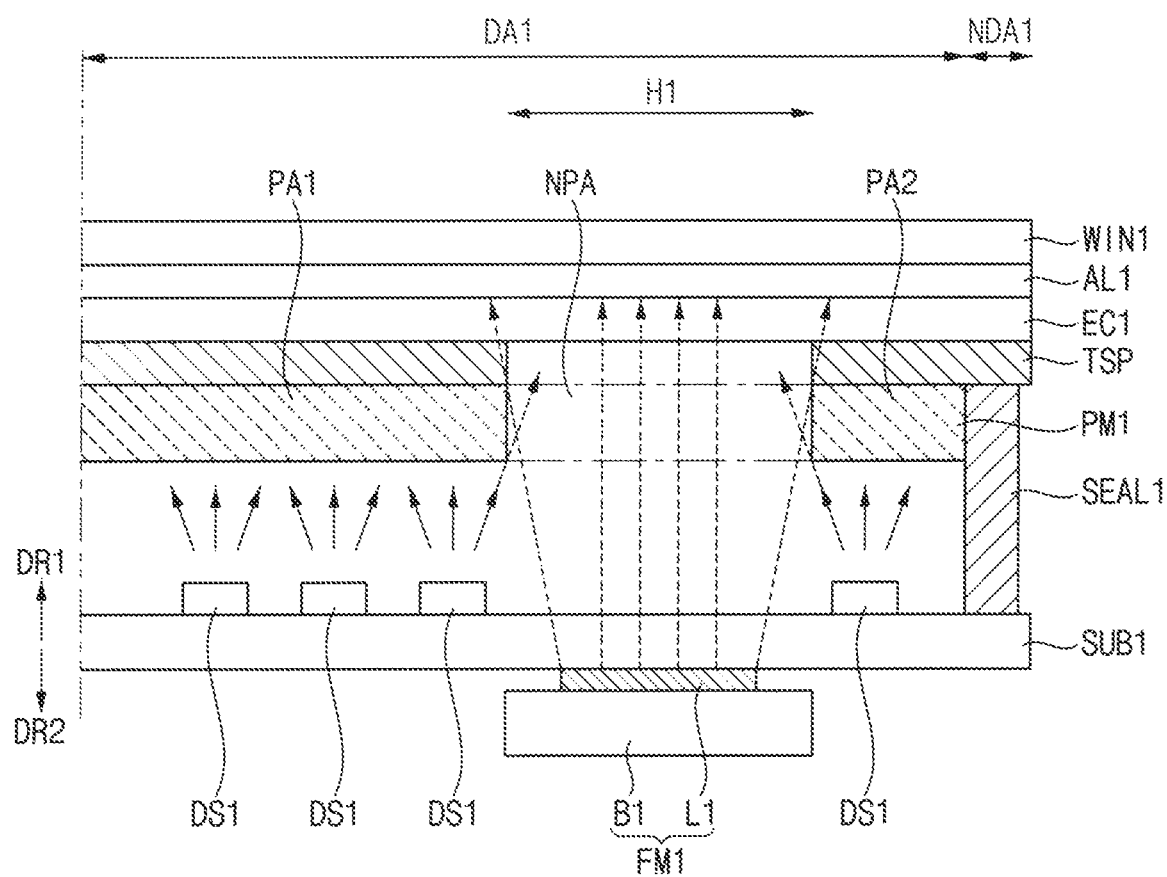

FIGS. 22A and 22B are diagrams illustrating display devices according to an embodiment. FIGS. 22A and 22B may be substantially the same as the above-described display device except that a touch screen panel is added to the above-described display device.

Referring to FIGS. 22A and 22B, the display device may further include a touch screen panel TSP. In embodiments, the touch screen panel TSP may be disposed on the encapsulation substrate EC1. For example, the touch screen panel TSP may be disposed on an upper surface of the encapsulation substrate EC1 or may be disposed on a lower surface of the encapsulation substrate EC1.

The display device may recognize a touch caused by an external stimulus through the touch screen panel TSP. The touch screen panel TSP may include touch sensors and touch signal lines. The touch sensors and the touch signal lines may have a single-layer or multi-layer structure. The touch sensors and touch signal lines may include a conductive material. In some of the drawings, the touch screen panel TSP is excluded in description of embodiments of the inventive concept. For example, the above-described drawings may have substantially the same structure as those of FIGS. 22A and 22B.

In this case, an area of the touch screen panel TSP that overlaps the functional module may be a hole, and external light may be recognized through the hole.

In accordance with one or more embodiments of the inventive concept, a display device and a method of manufacturing the display device are provided where the display device may include or be included in, for example, a smartphone, a tablet, a notebook, a monitor, or a television.

Although the display device and the method of manufacturing the display device according to the embodiments have been described with reference to the drawings, the illustrated embodiments are examples, and may be modified and changed by a person having ordinary knowledge in the relevant technical field without departing from the technical spirit described in the following claims. The embodiments may be combined to form additional embodiments.

What is claimed is:

1. A display device, comprising:
   a substrate;
   a plurality of light emitting elements disposed on the substrate;
   an encapsulation substrate disposed over the light emitting elements;
   a seal between the substrate and the encapsulation substrate, the seal forming a space between the substrate and the encapsulation substrate; and
   a polarizing layer disposed in the space at a position between the light emitting elements and the encapsulation substrate, and including a polarization area and a non-polarization area.

2. The display device of claim 1, wherein the polarization area includes:
   a first polarization area, and
   a second polarization area spaced apart from the first polarization area by the non-polarization area.

3. The display device of claim 2, wherein the light emitting elements overlap the first polarization area and the second polarization area.

4. The display device of claim 1, wherein:
   the non-polarization area includes first to (n−1)-th non-polarization areas spaced apart from each other, where n is a natural number of 3 or more, and
   the polarization area includes first to (n)-th polarization areas spaced apart from each other by each of the first to (n−1)-th non-polarization areas.

5. The display device of claim 4, wherein the light emitting elements overlap the first to (n)-th polarization areas.

6. The display device of claim 1, wherein the substrate includes:
   a base substrate including rigid material; and
   a transistor disposed on the base substrate and electrically connected to the light emitting elements.

7. The display device of claim 1, further comprising:
   a functional area disposed under the substrate and overlapping the non-polarization area, wherein the functional area includes at least one of a camera, a face recognition sensor, a pupil recognition sensor, an acceleration sensor, a proximity sensor, an infrared sensor, an illuminance sensor, or a light sensor.

8. A display device comprising:
   a substrate;
   a plurality of light emitting elements disposed on the substrate;
   an encapsulation substrate disposed over the light emitting elements;
   a polarizing layer disposed between the light emitting elements and the encapsulation substrate and including a polarization area and a non-polarization area;
   an adhesive layer disposed on the encapsulation substrate; and
   a window layer disposed on the adhesive layer.

9. A display device, comprising:
   a substrate;
   a plurality of light emitting elements disposed on the substrate;

an encapsulation substrate disposed over the light emitting elements;

a seal between the substrate and the encapsulation substrate, the seal forming a space between the substrate and the encapsulation substrate;

a polarizing layer disposed in the space at a position between the light emitting elements and the encapsulation substrate and including a polarization area and a non-polarization area; and a functional area disposed under the substrate and overlapping the non-polarization area, wherein the polarization area includes a first polarization area and a second polarization area spaced apart from the first polarization area by the non-polarization area, wherein the light emitting elements overlap the first polarization area and the second polarization area, and wherein the substrate includes:

a base substrate including rigid material; and a transistor disposed on the base substrate and electrically connected to the light emitting elements.

10. A method of manufacturing a display device, comprising:

forming a plurality of light emitting elements on a substrate;

forming an encapsulation substrate;

forming a polarizing layer on the encapsulation substrate;

forming a polarization area and a non-polarization area in the polarizing layer by bleaching the polarizing layer;

bonding the encapsulation substrate and the substrate so that the polarizing layer faces the substrate and forms a space between the encapsulation substrate and the substrate by a sealing; and disposing a functional area under the substrate to overlap the non-polarization area.

11. The method of claim 10, wherein:

after forming the polarization area and the non-polarization area on the polarizing layer, the encapsulation substrate and the substrate are bonded together.

12. The method of claim 11, wherein:

in forming the polarization area and the non-polarization area in the polarizing layer, the non-polarization area is formed by irradiating a laser having a wavelength of about 100 nm to about 1000 nm in the polarizing layer.

13. The method of claim 11, wherein:

in forming the polarization area and the non-polarization area in the polarizing layer, the method includes treating the polarizing layer with a chemical material to form the non-polarization area.

14. The method of claim 13, wherein the chemical material includes a basic material.

15. The method of claim 11, wherein forming the polarization area and the non-polarization area in the polarizing layer includes:

irradiating the polarizing layer with a laser having a wavelength of about 100 nm to about 1000 nm; and after irradiating the polarizing layer, forming the non-polarization area in the polarizing layer by treating an area to which the laser is irradiated with a chemical material.

16. The method of claim 15, wherein the chemical material includes a neutral material.

17. The method of claim 10, wherein:

after bonding the encapsulation substrate and the substrate, forming the polarization area and the non-polarization area in the polarizing layer.

18. The method of claim 17, wherein:

in forming the polarization area and the non-polarization area in the polarizing layer, the non-polarization area is formed by irradiating a laser having a wavelength of about 100 nm to about 1000 nm in the polarizing layer.

19. The method of claim 10, further comprising:

disposing an adhesive layer on the encapsulation substrate; and disposing a window layer on the adhesive layer.

* * * * *